(12) United States Patent
Herring et al.

(10) Patent No.: US 7,724,083 B2
(45) Date of Patent: May 25, 2010

(54) METHOD AND APPARATUS FOR JOSEPHSON DISTRIBUTED OUTPUT AMPLIFIER

(75) Inventors: Quentin P. Herring, Ellicott City, MD (US); Donald Lynn Miller, Export, PA (US); John Xavier Przybysz, Severna Park, MD (US)

(73) Assignee: Northrop Grumman Systems Corporation, Los Angeles, CA (US)

( * ) Notice: Subject to any disclaimer, the term of this patent is extended or adjusted under 35 U.S.C. 154(b) by 0 days.

(21) Appl. No.: 12/186,465

(22) Filed: Aug. 5, 2008

(65) Prior Publication Data

US 2010/0033252 A1 Feb. 11, 2010

(51) Int. Cl.
*H03F 3/60* (2006.01)
*H03K 19/195* (2006.01)

(52) U.S. Cl. ............... 330/54; 330/56; 330/276; 330/277; 326/3; 326/5; 326/1; 327/367

(58) Field of Classification Search ............... 326/1–5; 327/367, 221, 528; 330/54, 277, 276, 286
See application file for complete search history.

(56) References Cited

U.S. PATENT DOCUMENTS

| | | | |
|---|---|---|---|
| 3,582,804 A * | 6/1971 | Beck .................. | 330/54 |
| 4,117,354 A | 9/1978 | Geewala | |
| 4,916,335 A | 4/1990 | Goto et al. | |
| 5,099,152 A | 3/1992 | Suzuki | |
| 5,191,236 A * | 3/1993 | Ruby .................. | 327/528 |
| 5,309,038 A | 5/1994 | Harada et al. | |
| 5,479,131 A | 12/1995 | Lee | |
| 6,049,250 A * | 4/2000 | Kintis et al. ............ | 330/54 |
| 6,188,236 B1 | 2/2001 | Wikborg | |
| 6,242,939 B1 * | 6/2001 | Nagasawa et al. ........ | 326/3 |
| 6,507,234 B1 | 1/2003 | Johnson et al. | |

(Continued)

FOREIGN PATENT DOCUMENTS

EP 0467104 1/1992

(Continued)

OTHER PUBLICATIONS

Berns et al., "Coherent Quasiclassical Dynamics of a Persistent Current Qubit", *Physical Review Letters APS USA*, vol. 97, No. 15, pp. 150502, Oct. 13, 2006.

(Continued)

*Primary Examiner*—Vibol Tan
(74) *Attorney, Agent, or Firm*—Tarolli, Sundheim, Covell & Tummino LLP

(57) ABSTRACT

The disclosure generally relates to a method and apparatus for providing high-speed, low signal power amplification. In an exemplary embodiment, the disclosure relates to a method for providing a wideband amplification of a signal by forming a first transmission line in parallel with a second transmission line, each of the first transmission line and the second transmission line having a plurality of superconducting transmission elements, each transmission line having a transmission line delay; interposing a plurality of amplification stages between the first transmission line and the second transmission line, each amplification stage having an resonant circuit with a resonant circuit delay; and substantially matching the resonant circuit delay for at least one of the plurality of amplification stages with the transmission line delay of at least one of the superconducting transmission lines.

37 Claims, 4 Drawing Sheets

U.S. PATENT DOCUMENTS

| | | | |
|---|---|---|---|
| 6,518,786 B2 | 2/2003 | Herr | |
| 6,549,059 B1 | 4/2003 | Johnson | |
| 6,724,216 B2 | 4/2004 | Suzuki et al. | |
| 6,750,794 B1 | 6/2004 | Durand et al. | |
| 6,865,639 B2 | 3/2005 | Herr | |
| 6,960,780 B2 | 11/2005 | Blais et al. | |
| 7,425,869 B2 * | 9/2008 | Aoki et al. | 330/276 |
| 7,495,515 B1 * | 2/2009 | Branch et al. | 330/305 |
| 7,498,832 B2 | 3/2009 | Baumgardner et al. | |
| 7,598,897 B2 * | 10/2009 | Kirichenko | 341/172 |
| 2002/0063643 A1 | 5/2002 | Smith et al. | |
| 2002/0190381 A1 | 12/2002 | Herr et al. | |
| 2003/0011398 A1 | 1/2003 | Herr | |
| 2003/0016069 A1 | 1/2003 | Furuta et al. | |
| 2003/0039138 A1 | 2/2003 | Herr | |
| 2003/0040440 A1 | 2/2003 | Wire et al. | |
| 2003/0115401 A1 | 6/2003 | Herr | |
| 2003/0183935 A1 | 10/2003 | Herr et al. | |
| 2004/0120444 A1 | 6/2004 | Herr | |
| 2004/0201099 A1 | 10/2004 | Herr | |
| 2004/0201400 A1 | 10/2004 | Herr | |
| 2005/0001209 A1 | 1/2005 | Hilton et al. | |
| 2005/0023518 A1 | 2/2005 | Herr | |
| 2005/0110106 A1 | 5/2005 | Goto et al. | |
| 2005/0224784 A1 | 10/2005 | Amin et al. | |
| 2006/0062277 A1 * | 3/2006 | Friedrich et al. | 375/130 |

FOREIGN PATENT DOCUMENTS

| | | |
|---|---|---|
| WO | WO 2005/093649 | 10/2005 |
| WO | PCT/US2008/072017 | 8/2008 |

OTHER PUBLICATIONS

Garanin et al., Effects of nonlinear sweep in the Landau-Zener-Stueckelberg effect, *Physical Review B*, vol. 66, No. 17, pp. 174438-1-174438-11, Nov. 1, 2002.

Wulf et al., Dressed States of Josephson Phase Qubit Coupled to an LC Circuit, *IEEE Transaction on Applied Superconductivity IEEE USA*, vol. 15, No. 2, pp. 856-859, Jun. 2, 2005.

A NRZ—Output Amplifier for RSFQ Circuits, Koch et al., IEEE Transaction on Applied Superconductivity, vol. 9, No. 2, pp. 3549-3552, Jun. 1999.

U.S. Appl. No. 11/654,632, filed Jan. 2007, Herr.

Experimental Analysis of a New Generation of Compact Josephson-Inductance-Based RSFQ Circuits, Ortlepp et al., *11th International Superconductive Electronics Conference*, 3 pages, Jun. 10, 2007.

Tarutani et al., "Interface Circuit Using JTLs as Control Lines of SQUID Array", IEEE Transactions on Applied Superconductivity, vol. 11, No. 1 Mar. 2001, pp. 341.344.

* cited by examiner

METHOD AND APPARATUS FOR JOSEPHSON DISTRIBUTED OUTPUT AMPLIFIER

BACKGROUND

1. Field of the Invention

The disclosure generally relates to wideband distributed amplifiers. More specifically, the disclosure relates to a method and apparatus for providing high-speed, low signal power amplification using superconducting technology.

2. Description of Related Art

A well-known wideband amplifier known as a distributed amplifier amplifies the incoming signal to an output signal commensurate with the desired amplification level. Distributed amplifier architecture introduces delay to achieve wideband characteristics. Conventional distributed amplifiers include a pair of transmission lines, each having a characteristic impedance, for independently connecting the inputs and outputs of several active devices.

FIG. 1 shows the circuit diagram for a conventional distributed amplifier ("DA"). In FIG. 1, input signal 100 is directed to a first transmission line 110 having impedances $Z_{I-1}$ to $Z_{I-5}$. The amplified output signal 190 is provided by the transmission line 120 which includes impedances $Z_{O-1}$ to $Z_{O-5}$. In the embodiment of FIG. 1, active devices are modeled as field effect transistors ("FET") $Q_1$, $Q_2$, $Q_3$ and $Q_4$. As the input signal 100 propagates down the input transmission line 100, each FET responds to the forward-traveling input step by inducing an amplified forward-traveling wave on the output transmission line 120. The number of active devices defines the number of stages for the DA. The amplifier of FIG. 1, shows 4 stages.

The gain of the distributed amplifier is additive rather than multiplicative. The gain is determined, in part, by the number of stages. This property enables the distributed amplifier to provide a gain at frequencies beyond that of the unity-gain frequency of any individual stage. The delays of the input transmission line 110 and the output transmission line 120 can be made equal through the selection of propagation constants and line lengths to ensure that the output signals from each individual device sums in phase. Both input and output lines must be resistively terminated, by resistors 130 and 140. A major drawback of the conventional distributed amplifier is poor efficiency because power matching and phasing cannot be achieved at the same time.

A conventional distributed amplifier is also inoperable with high-speed superconducting systems. Superconductor digital circuits feature high clock rates (i.e., 10-40 GHz) and extremely low signal power levels (i.e., 2-8 nW). Superconductor circuits are ideally suited for mixed-signal applications such as analog to digital conversion due to high sample rates and quantum accurate feedback distributed amplifiers, which use the same operating principles as the metrological voltage standard. However, because signal levels are so low and data rates are so high, establishing data links to conventional electronics, at low bit error rate, has been proved difficult.

Therefore, there is a need for a method and apparatus to provide a distributed amplifier adapted to high clock rates and low signal power.

SUMMARY

In one embodiment, the disclosure relates to a method for providing a wideband amplification of a signal, the method comprising: forming a first transmission line in parallel with a second transmission line, each of the first transmission line and the second transmission line having a plurality of superconducting transmission elements, each transmission line having a transmission line delay; interposing a plurality of amplification stages between the first transmission line and the second transmission line, each amplification stage having an resonant circuit with a resonant circuit delay; and substantially matching the resonant circuit delay for at least one of the plurality of amplification stages with the transmission line delay of at least one of the superconducting transmission lines to provide a wideband amplification of an input signal.

In another embodiment, the disclosure relates to a distributed amplifier circuit comprising: a first transmission line and a second transmission line, each of the first transmission line and the second transmission line having a plurality of Josephson Transmission lines ("JTLs"), each JTL having a Josephson transmission delay; a plurality of resonant circuits connected in series and including a voltage source controlled with at least one of the first transmission line or the second transmission line, one of the plurality of the resonant circuits having a resonant transmission delay; wherein the resonant transmission delay is substantially matched to the Josephson transmission delay of at least one of the plurality of JTLs.

In still another embodiment, the disclosure relates to a superconductor driver for high throughput data amplification, comprising: a first amplification stage having a first Josephson transmission line (JTL) and a second Josephson transmission line with a resonant circuit interposed therebetween, the first Josephson transmission line having a first transmission line delay and the second Josephson transmission line having a second transmission line delay, the resonant circuit configured to have a resonant circuit delay substantially matching the first transmission line delay.

In yet another embodiment, the disclosure relates to a superconducting amplifier comprising: a first transmission line having a plurality of Josephson transmission lines (JTLs) connected in series, each JTL having a respective JTL delay; a plurality of voltage sources arranged in series with a plurality of resonant circuits, each of the plurality of voltage sources electro-magnetically communicating with at least one JTL; and wherein each voltage source defines a SQUID which is set and reset through an inductive coupling with one of the JTLs.

BRIEF DESCRIPTION OF THE DRAWINGS

These and other embodiments of the disclosure will be discussed with reference to the following exemplary and non-limiting illustrations, in which like elements are numbered similarly, and where.

DETAILED DESCRIPTION

Figure 1:
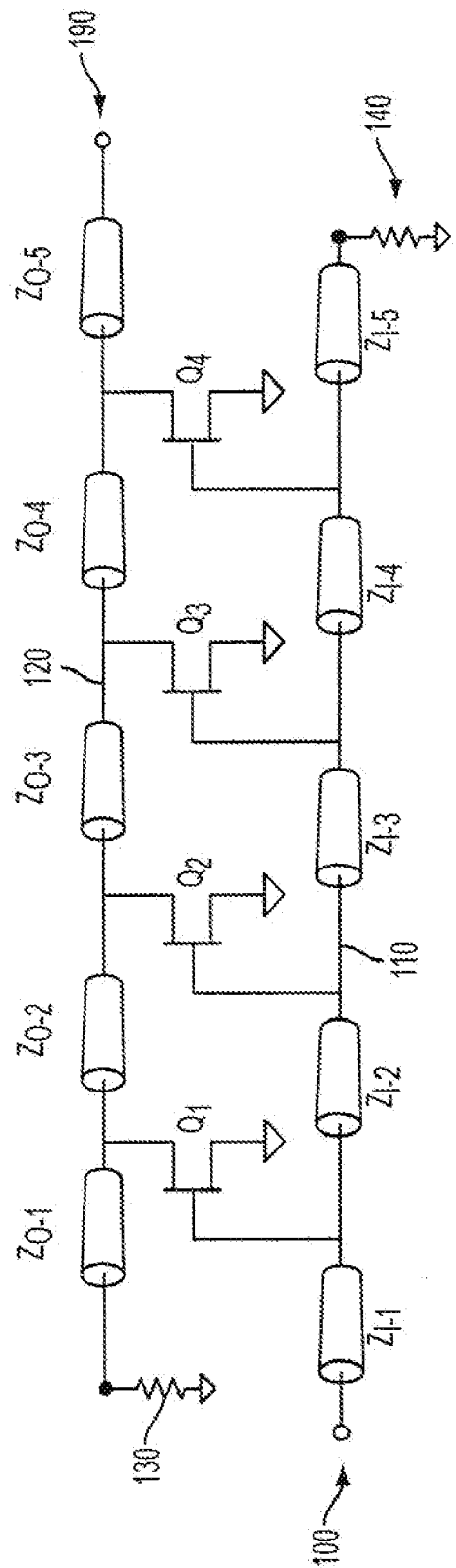
FIG. 1 shows the circuit diagram for a conventional distributed amplifier.
Figure 2:
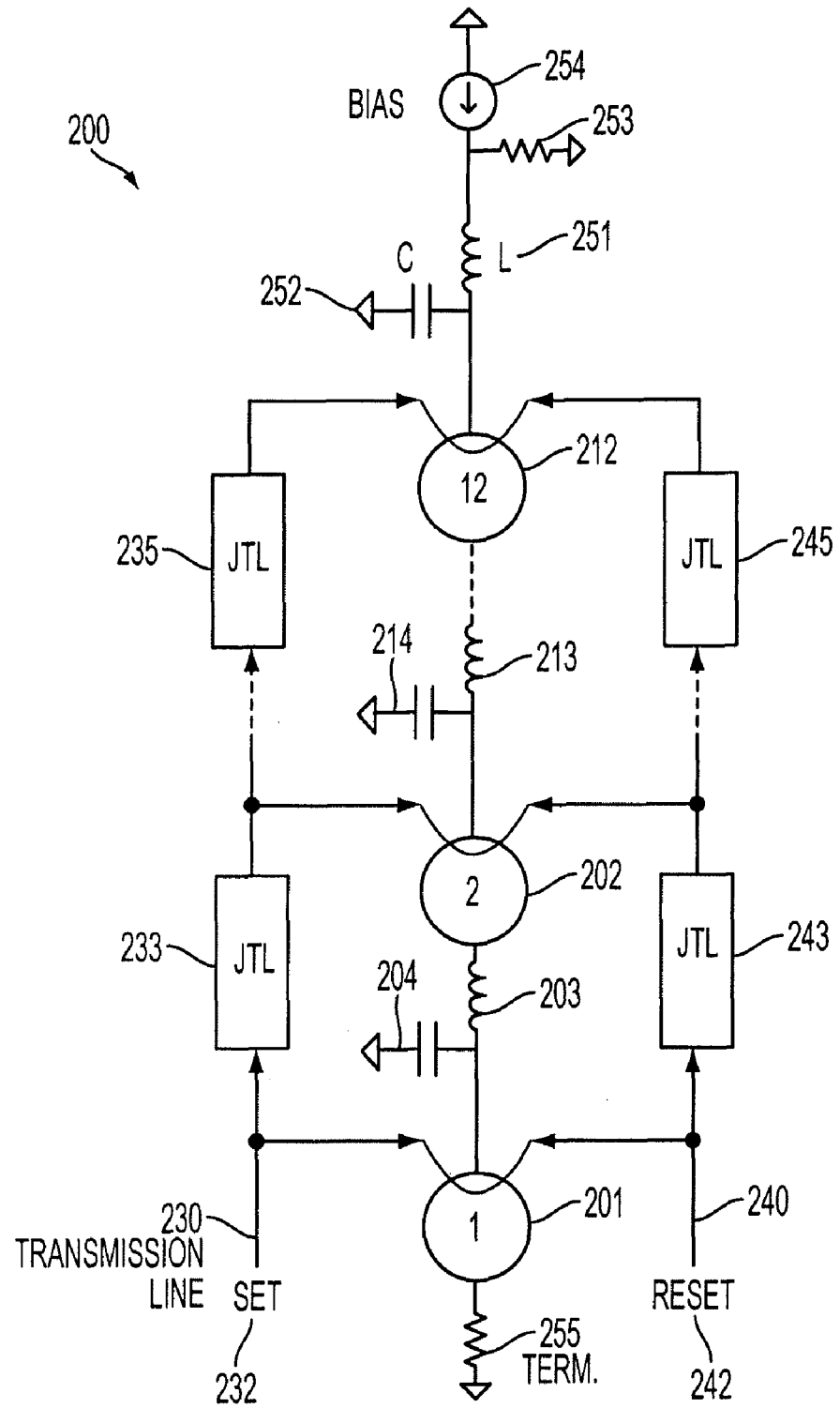
FIG. 2 schematically illustrates a distributed amplifier according to one embodiment of the disclosure.

FIG. 2 schematically illustrates a distributed amplifier according to one embodiment of the disclosure. Circuit 200 of FIG. 2 illustrates a 12 stage amplifier represented by stages 1, 2 . . . 12. For brevity, only stages, 1, 2 and 12 are shown. Each stage is shown as having a voltage source. Thus, the first stage includes voltage source 201; the second stage is shown with voltage source 202. Amplification stage 12 is shown with voltage source 212. Each stage may optionally include a lumped resonant circuit connected to the voltage source. In FIG. 2, voltage source 202 is connected to inductor 203 and capacitor 204. Inductor 203 and capacitor 204 form a lumped resonant circuit. Similarly, voltage source 12 is connected to inductor 213 and capacitor 214.

FIG. 2 also shows bias 254 connected in parallel with resistor 253. In an exemplary application, termination resistor 255 was matched to resistor 253 and each was provided with 50Ω resistance. A lumped circuit comprising inductor 251 and capacitor 252 are connected in series with bias 253. Circuit 200 terminates in the 50 Ohm resistor 255. 254 and 253 are not explicit parts of the amplifier, but are external power supply and load. Resistor 255 may be an explicit part of the amplifier, or it may also be an external load.

In FIG. 2, a combination of an inductor and a capacitor forms a lumped LC circuit having a characteristic transmission delay. Determining the value of the transmission delay through the lumped circuit is well-known in the art and is not discussed here. In one embodiment of the disclosure, inductors 203, 213 and other inductors in circuit 200, are selected to have an identical inductance. In another embodiment of the disclosure, inductors for each stage can be selected to have a unique inductance value independent of the inductors in other amplification stages. Similarly, capacitors 204, 214 can be selected to provide substantially identical capacitance with the other capacitors of different amplification stages. In another embodiment, a capacitor can be selected to have a unique capacitance value independent of the capacitors of the other amplification stages.

Transmission lines 230 and 240 are formed in parallel and communicate set/reset signals to each amplification stage. In the embodiment of FIG. 2, transmission line 230 provides set signal 232 to amplification stages 1-12 while transmission line 240 provides reset signal 242 to amplification stages 1-12.

In one embodiment of the disclosure, transmission lines 230 and 240 are configured to have one or more Josephson transmission lines ("JTLs") for transmitting the set/reset signals. Josephson transmission lines are advantageous for providing high clock rates and low signal power. Each JTL has a characteristic transmission delay. Referring to FIG. 2, JTLs 233 and 235 are serially connected along transmission line 230 and JTLs 243 and 245 are serially connected along transmission lines 240.

According to one embodiment of the disclosure, an amplification stage comprises two JTLs connected in parallel with a voltage source and a resonant circuit interposed therebetween. Referring to exemplary embodiment of FIG. 2, JTL 233 and JTL 243 are connected to voltage source 202. JTL 233 provides set signal 232 to voltage source 202 while JTL 243 provides reset signal to voltage source 202. The second amplification stage also includes inductor 203 and capacitor 204 connected in series with voltage source 202. While the exemplary embodiment of FIG. 2 shows inductor 203 and capacitor 204 as the resonant circuit, it should be noted that the disclosure is not limited exclusively to an inductor and a capacitor connected to the voltage source. Indeed, any active or passive circuit configuration having a characteristic delay can be used in place of a resonant circuit. For example, the delay could be provided by a passive transmission line circuit.

The set signal 232 and reset signal 242 provide extremely small, single flux quantum ("SFQ") voltage pulses to each amplification. An exemplary set/reset signal may be about 0.5 mV high and 4 pS wide, FWHM. The SFQ signals are distributed on the active JTLs and turn ON and OFF the voltage sources connected in series. In one embodiment, each JTL was built to provide about 6 pS delay. The resonant circuit was selected to have a resonant delay of about 6 pS, thereby matching the resonant delay of the JTLs. Thus, the resonant circuit delay was matched to a JTL delay of about 6 pS. The resonant circuit also provided 50 Ohm impedance and the circuit provided 20 GHz bandwidth, supporting 10 Gb/S NRZ data. The amplifier bandwidth-gain product was substantially higher than that of the conventional distributed amplifiers, and substantially higher than other amplifiers of SFQ input signals.

Figure 3:
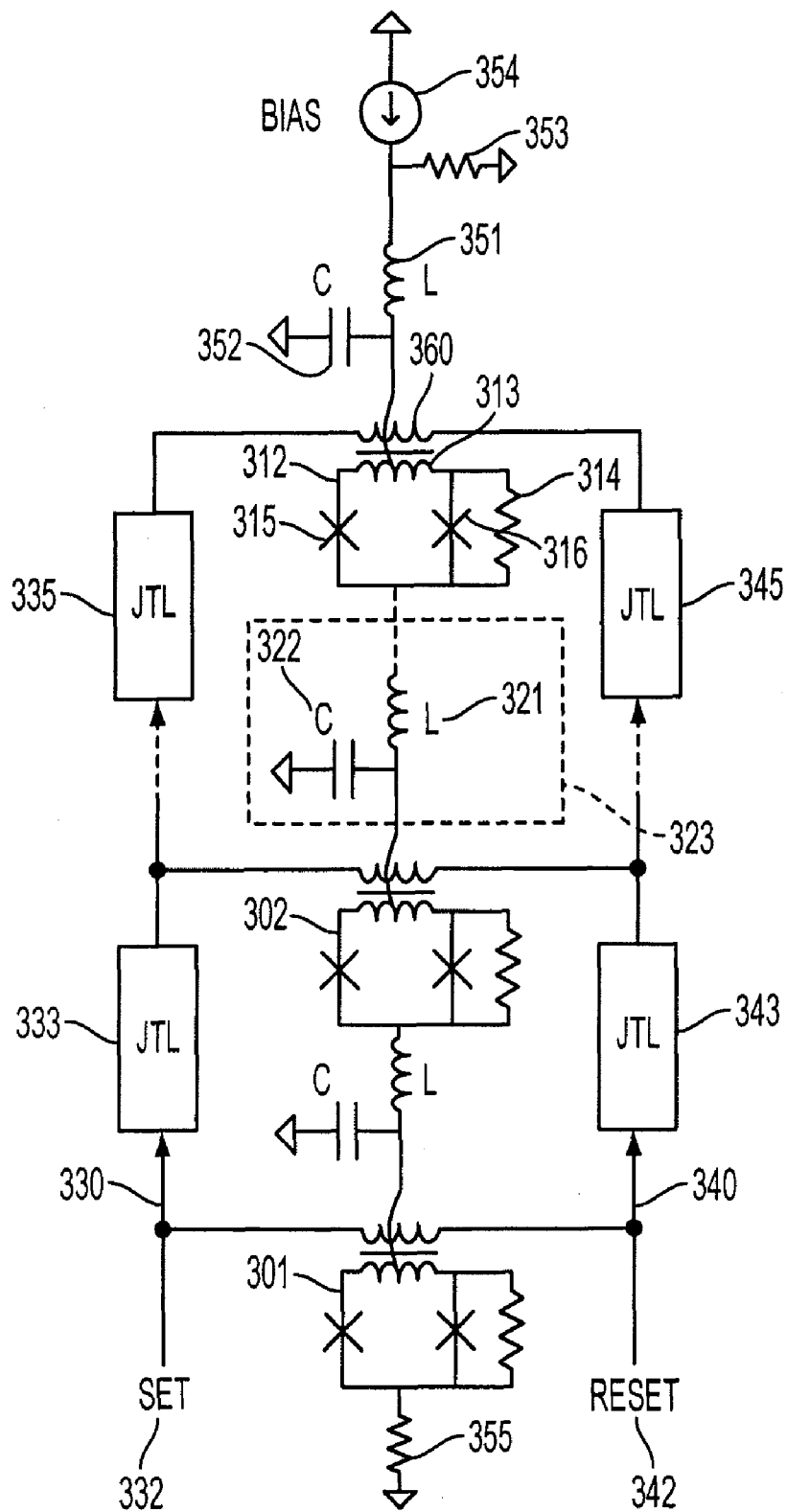
FIG. 3 schematically illustrates the device-level detail of the distributed amplifier of FIG. 2.

FIG. 3 schematically illustrates the device-level detail of the distributed amplifier of FIG. 2. More specifically, FIG. 3 provides a detailed drawings of a distributed amplifier having an exemplary voltage source. The distributed amplifier of FIG. 3 illustrates a 12 stage amplifier. For brevity, only stages 1, 2 and 12 are shown. In FIG. 3, bias 354 is connected to resistor 353 and a lumped LC circuit comprising inductor 351 and capacitor 352.

Voltage sources 301, 302 . . . 312 include two Josephson junctions arranged in a superconducting-quantum-interference-device ("SQUID"). Each voltage source is set and reset through inductive coupling with transmission lines 330 and 340. SQUID 312 comprises Josephson junctions 315 and 316, as well as inductor 313 and shunt resistor 314. The shunt resistor in each SQUID (applied asymmetrically to the right junction, as shown) enforces the out-of-phase voltage mode required to reset the circuit. During operation, inductor 360 is energized by an SFQ Pulse from Set/Reset gates 332/342. The inductive coupling energizes inductor 313 of SQUID 312. Shunt resistor 314 provides out-of-phase voltage mode which enables resetting SQUID circuit 312. The application of shunt resistor 314 with SQUID 312 is exemplary and non-limiting. Other circuit configurations which enable resetting of the SQUID circuit can be used without departing from the principles disclosed herein.

Similar to FIG. 2, transmission lines 330 and 340 comprise JTLs 333, 335, 345 and 343 (additional JTLs are omitted for brevity). In addition, each voltage source is serially connected to a resonant circuit including an inductor and a capacitor. Thus, voltage source 312 is connected to inductor 321 and capacitor 322, which cumulatively form resonant circuit (interchangeably, lumped LC circuit) 323.

In one embodiment of the disclosure, the active Josephson transmission delay on the input is matched to lumped LC transmission line delay on the output. Thus, transmission delay through JTL 335 can be matched to transmission delay of lumped LC circuit 323. In another embodiment, transmission delay through JTL 345 can be matched to transmission delay of lumped LC circuit 323. In still another embodiment, each of JTLs 335, 345 is selected to have a transmission line delay matching that of lumped circuit 323. In still another embodiment, lump circuit 323 has a characteristic delay matching transmission line delay through JTL 333 or 343.

Each voltage source shown in FIG. 3 was externally loaded by 355 and 353 according to the following Equation:

$$(50\Omega+50\Omega)/12=8\ \Omega \tag{1}$$

In one embodiment of FIG. 3, shunt resistor 314 is selected to be smaller than the value of Equation 1. That is, shunt resistor 314 can be selected to be smaller than 8 Ω.

Figure 4:
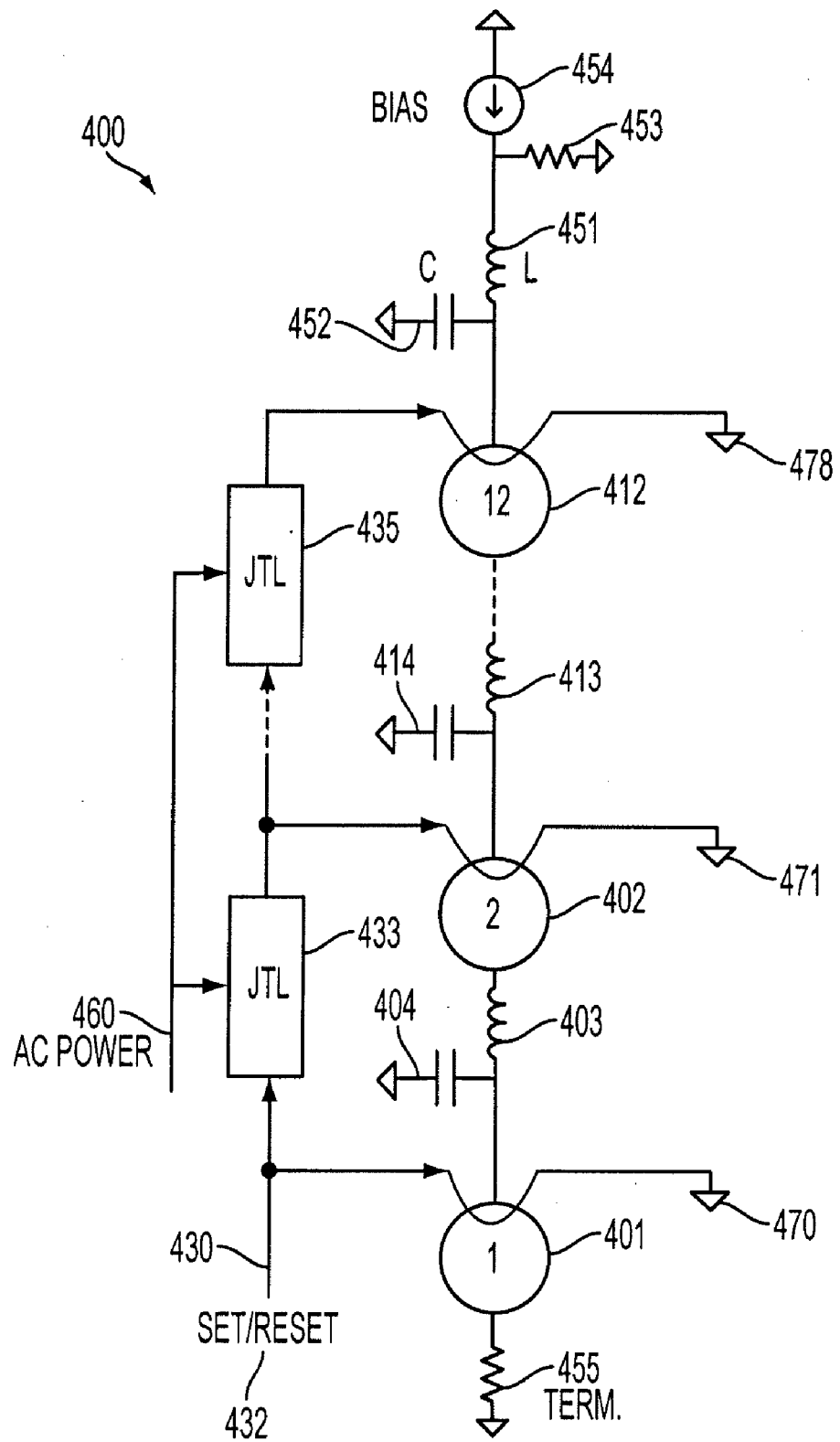
FIG. 4 schematically illustrates a distributed amplifier according to another embodiment of the disclosure.

FIG. 4 schematically illustrates a distributed amplifier according to another embodiment of the disclosure. Circuit 400 of FIG. 4 comprises bias 454 connected in parallel with resistor 453. In an exemplary implementation of circuit 400, resistor 453 was selected as 50Ω resistor. As with FIGS. 2 and 3, the embodiment of FIG. 4 comprises of 12 voltage sources corresponding to 12 amplification stages. For brevity, only the first, second and twelfth voltage sources are shown.

In FIG. 4, set/reset signal 432 is provided to transmission line 430. The set and reset signals have opposite polarity so that the reset pulse annihilates the signal generated by the set pulse. The set and reset pulse can each define an SFQ signal. Thus, the set and reset pulses 432 are applied to transmission line 430 input. Propagation of signals of opposite polarity requires AC power source on the JTL instead of DC power as shown in FIG. 4.

Transmission line 430 comprises a plurality of JTLs, with each JTL matched to an amplification stage such that a circuit with n amplification stages has n−1 JTLs. As discussed, each JTL has a characteristic delay associated therewith.

In contrasts with circuits of FIGS. 2 and 3, each voltage source of circuit 400 communicates with only one transmission line (transmission line 430). Thus, voltage sources 401, 402 and 412 are connected to transmission line 432 and are grounded through lines 470, 471 and 478 respectively. Because the set and reset signals can be SFQ signals of opposite polarity, circuit 400 can be directly connected to "flux-powered signal-flux-quantum circuits," as described in patent filing XXX for signal amplification and readout.

As with flux-powered single-flux-quantum logic gates, such an amplifier configuration can avoid static power dissipation in the JTL by elimination of the associated bias resistors.

Inductor 451 and capacitor 452 complete circuit 400 by forming a resonant circuit which communicates with voltage source 412. In one exemplary embodiment, resistor 455 was matched to resistor 453 and each was provided a 50Ω resistance.

While the principles of the disclosure have been illustrated in relation to the exemplary embodiments shown herein, the principles of the disclosure are not limited thereto and include any modification, variation or permutation thereof.

What is claimed is:

1. A method for providing a wideband amplification of a signal, the method comprising:
    forming a first transmission line in parallel with a second transmission line, each of the first transmission line and the second transmission line having a plurality of superconducting transmission elements, each transmission element having a transmission delay;
    interposing a plurality of amplification stages between the first transmission line and the second transmission line, each amplification stage having an resonant circuit with a resonant circuit delay; and
    substantially matching the resonant circuit delay for at least one of the plurality of amplification stages with the transmission line delay of at least one of the superconducting transmission lines to provide a wideband amplification of an input signal.

2. The method of claim 1, wherein the superconducting transmission elements defines one or more Josephson junctions connected in parallel.

3. The method of claim 1, wherein the transmission elements of the first transmission line are connected in series.

4. The method of claim 1, further comprising providing a plurality of voltage sources, each voltage source communicating with a respective resonant circuit.

5. The method of claim 1, wherein at least one voltage source comprises a SQUID.

6. The method of claim 1, further comprising setting and resetting each of the plurality of voltage sources through inductive coupling with the superconducting transmission lines.

7. The method of claim 1, further comprising substantially matching the resonant circuit delay for one of the amplification stages with one of the transmission line delays.

8. The method of claim 1, further comprising providing a setting signal and a resetting signal to the first transmission line and the second transmission line, respectively.

9. The method of claim 1, the transmission line further comprising at least one Josephson junction.

10. A distributed amplifier circuit comprising:
    a first transmission line and a second transmission line, each of the first transmission line and the second transmission line having a plurality of Josephson Transmission lines ("JTLs"), each JTL having a Josephson transmission delay;
    a plurality of resonant circuits connected in series, including a voltage source controlled with at least one of the first transmission line or the second transmission line, one of the plurality of the resonant circuits having a resonant transmission delay;
    wherein the resonant transmission delay is substantially matched to the Josephson transmission delay of at least one of the plurality of JTLs.

11. The distributed amplifier circuit of claim 10, further comprising a plurality of voltage sources connected in series with the plurality of resonant circuits.

12. The distributed amplifier circuit of claim 10, wherein the voltage source further comprising a resistively shunted SQUID circuit.

13. The distributed amplifier circuit of claim 10, wherein the resistive shunt is asymmetrical.

14. The distributed amplifier circuit of claim 10, wherein the resonant circuit defines an LC circuit having a first signal transmission delay.

15. The distributed amplifier circuit of claim 10, further comprising a dc-powered, controllable voltage source.

16. The distributed amplifier circuit of claim 10, wherein the first transmission line is in parallel with the second transmission line and wherein each of the first transmission line and the second transmission line including a plurality of Josephson junctions.

17. The distributed amplifier circuit of claim 10, wherein a first JTL from the first transmission line connected to a first voltage source, a first resonant circuit and a first JTL from the second transmission line forming an amplifier stage.

18. The distributed amplifier circuit of claim 10, wherein each Josephson transmission line further comprises a plurality of Josephson junctions connected in parallel.

19. A superconductor driver for high throughput data amplification, comprising:
    a first amplification stage having a first Josephson transmission line (JTL) and a second Josephson transmission line with a resonant circuit interposed therebetween,
    the first Josephson transmission line having a first transmission line delay and the second Josephson transmission line having a second transmission line delay,
    the resonant circuit configured to have a resonant circuit delay substantially matching the first transmission line delay.

20. The superconductor driver of claim 19, wherein the resonant circuit delay substantially matches the second transmission line delay.

21. The superconductor driver of claim 19, further comprising a voltage source in communication with the resonant circuit.

22. The superconductor driver of claim 21, the voltage source further comprises a SQUID configured to be set and reset through inductive coupling with the first JTL.

23. The superconductor driver of claim 21, the voltage source further comprises a resistively shunted SQUID.

24. The superconductor driver of claim 21, the resistive shunt is asymmetrical.

25. The superconductor driver of claim 21, the voltage source is externally loaded.

26. The superconductor driver of claim 19, further comprising a dc-powered voltage source controllable for providing voltage to the first amplification stage.

27. The superconductor driver of claim 19, further comprising a second amplification stage and a third amplification stage, the second amplification stage and the third amplification stage serially connected to the first amplification stage.

28. The superconductor driver of claim 27, wherein the first amplification stage receives a set input and a reset input, each input defined by a single flux quantum (SFQ) voltage pulse.

29. The superconductor driver of claim 27, the first amplification stage receives an SFQ voltage pulse and distributes the voltage pulse to the a plurality of second amplification stage and the third amplification stage.

30. A superconducting amplifier comprising:
    a first transmission line having a plurality of Josephson transmission lines (JTLs) connected in series, each JTL having a respective JTL delay;
    a plurality of voltage sources arranged in series with a plurality of resonant circuits, each of the plurality of voltage sources electro-magnetically communicating with at least one JTL; and
    wherein each voltage source defines a SQUID which is set and reset through an inductive coupling with one of the JTLs.

31. The superconducting amplifier of claim 30, wherein each resonant circuit having a resonant circuit delay.

32. The superconducting amplifier of claim 30, wherein at least one resonant circuit having a resonant circuit delay substantially matching the delay of one of the plurality of JTLs.

33. The superconducting amplifier of claim 30, further comprising a single flux quantum (SFQ) passing through the first transmission line sets the voltage source, and an SFQ of opposite polarity on the same first transmission line resets the voltage source.

34. The superconducting amplifier of claim 30, wherein the SQUID is asymmetrically-shunted to provide an internal out-of-phase voltage mode for resetting the voltage source.

35. The superconducting amplifier of claim 30, wherein the SQUID is activated through inductive coupling to the first transmission line.

36. The superconducting amplifier of claim 30, wherein the SQUID further comprises a shut resistor having a first resistance value.

37. The superconducting amplifier of claim 36, the SQUID is externally loaded, with the load resistance value greater than the first resistance value.

* * * * *

UNITED STATES PATENT AND TRADEMARK OFFICE
CERTIFICATE OF CORRECTION

PATENT NO. : 7,724,083 B2 Page 1 of 1
APPLICATION NO. : 12/186465
DATED : May 25, 2010
INVENTOR(S) : Quentin P. Herr, Donald L. Miller and John X. Przybysz It is certified that error appears in the above-identified patent and that said Letters Patent is hereby corrected as shown below:

Cover Page, (12) United States Patent, delete "Herring et al." and insert --Herr et al.--.

Cover page, (75) Inventors: delete "Quentin P. Herring," and insert --Quentin P. Herr,--.

Signed and Sealed this

Twenty-fourth Day of August, 2010

David J. Kappos
*Director of the United States Patent and Trademark Office*